(12) United States Patent
Kawai

(10) Patent No.: US 10,264,681 B2
(45) Date of Patent: Apr. 16, 2019

(54) ELECTRONIC COMPONENT BUILT-IN SUBSTRATE AND ELECTRONIC COMPONENT DEVICE

(71) Applicant: SHINKO ELECTRIC INDUSTRIES CO., LTD., Nagano-shi, Nagano (JP)

(72) Inventor: Kenji Kawai, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 15/632,706

(22) Filed: Jun. 26, 2017

(65) Prior Publication Data

US 2018/0007792 A1 Jan. 4, 2018

(30) Foreign Application Priority Data

Jun. 29, 2016 (JP) ................................. 2016-128746

(51) Int. Cl.
*H05K 1/02* (2006.01)
*H05K 1/05* (2006.01)
(Continued)

(52) U.S. Cl.
CPC ............ *H05K 1/185* (2013.01); *H01L 23/13* (2013.01); *H01L 23/5383* (2013.01); *H01L 23/5384* (2013.01); *H01L 23/5389* (2013.01); *H05K 1/0271* (2013.01); *H05K 1/05* (2013.01); *H05K 1/115* (2013.01); *H05K 3/4608* (2013.01); *H05K 3/4697* (2013.01); *H01L 23/145* (2013.01); *H01L 23/15* (2013.01); *H01L 2224/16227* (2013.01);
(Continued)

(58) Field of Classification Search
CPC ................... H05K 1/185; H05K 1/115; H05K 2201/10015; H05K 1/186; H01L 21/4853; H01L 21/4857; H01L 21/486; H01L 21/6835; H01L 23/3157; H01L 23/5383; H01L 23/5386; H01L 23/5389
USPC .................................................. 361/763, 761
See application file for complete search history.

(56) References Cited

U.S. PATENT DOCUMENTS

| 6,876,554 B1* | 4/2005 | Inagaki | H01G 4/224 361/763 |
| 2006/0145328 A1* | 7/2006 | Hsu | H01L 23/5389 257/690 |

(Continued)

FOREIGN PATENT DOCUMENTS

| JP | 2007-103939 | 4/2007 |
| JP | 2011-142286 | 7/2011 |

*Primary Examiner* — Michael P McFadden
(74) *Attorney, Agent, or Firm* — Rankin, Hill & Clark LLP

(57) ABSTRACT

A substrate includes a core substrate; a cavity formed on an upper surface side of the core substrate; a bottom plate of the cavity formed integrally with the core substrate; a through-hole formed in the bottom plate, a component mounting portion formed at a portion of the bottom plate, an electronic component mounted on the component mounting portion so as to be disposed inside the cavity; a first insulating layer formed on an upper surface of the core substrate so as to cover an upper surface of the electronic component; and a second insulating layer formed on a lower surface of the core substrate so as to fill the through-hole and cover a lower surface of the electronic component. The cavity is filled with the first insulating layer and the second insulating layer. The first insulating layer and the second insulating layer are formed of the same insulating resin.

20 Claims, 15 Drawing Sheets

(51) Int. Cl.
  *H05K 1/11* (2006.01)
  *H05K 1/18* (2006.01)
  *H05K 3/00* (2006.01)
  *H05K 3/42* (2006.01)
  *H05K 3/46* (2006.01)
  *H01L 23/13* (2006.01)
  *H01L 23/14* (2006.01)
  *H01L 23/15* (2006.01)
  *H01L 23/538* (2006.01)

(52) U.S. Cl.
  CPC ............... *H01L 2224/32225* (2013.01); *H01L 2224/73204* (2013.01); *H01L 2924/15311* (2013.01); *H01L 2924/3511* (2013.01); *H05K 1/186* (2013.01); *H05K 3/002* (2013.01); *H05K 3/429* (2013.01); *H05K 2201/10015* (2013.01)

(56) References Cited

U.S. PATENT DOCUMENTS

| | | | |
|---|---|---|---|
| 2007/0074900 A1 | 4/2007 | Lee et al. | |
| 2011/0164391 A1 | 7/2011 | Shin et al. | |
| 2013/0048361 A1* | 2/2013 | Yamashita | H01L 23/49822 174/260 |
| 2014/0247561 A1* | 9/2014 | Inui | H05K 1/186 361/707 |
| 2015/0282328 A1* | 10/2015 | Hamada | H05K 1/0242 361/764 |
| 2016/0141236 A1* | 5/2016 | Kurita | H01L 23/49822 361/761 |

\* cited by examiner (PARTIAL PLAN VIEW)

(PARTIAL PLAN VIEW)

(PARTIAL PLAN VIEW)

ELECTRONIC COMPONENT BUILT-IN SUBSTRATE AND ELECTRONIC COMPONENT DEVICE

CROSS-REFERENCE TO RELATED APPLICATION

The present application claims priority from Japanese Patent Application No. 2016-128746 filed on Jun. 29, 2016, the entire content of which is incorporated herein by reference.

BACKGROUND

Technical Field

The present invention relates to an electronic component built-in substrate and an electronic component device.

Related Art

In the related art, there are electronic component built-in substrates such as semiconductor chips and capacitors. In such electronic component built-in substrates, electronic components are disposed in cavities formed in core substrates, and wiring layers are connected to those electronic components.

[Patent Document 1] Japanese Patent Application Publication No. 2007-103939A
[Patent Document 2] Japanese Patent Application Publication No. 2011-142286A As will be described below with a preliminary technology, in some electronic component built-in substrates, cavities are formed in core substrates at predetermined depths in the thickness directions, and capacitors are mounted on the bottom plate portions of the cavities. Further, the upper surfaces and side surfaces of the capacitors are sealed by first insulating layers, and on the lower surfaces of the core substrates, second insulating layers are formed.

In such an electronic component built-in substrate, the structure of an area around a capacitor in the thickness direction is asymmetric with respect to the capacitor. Therefore, during a heating process, if thermal stress is generated due to a difference in the coefficient of thermal expansion between elements, the substrate is likely to be warped.

Also, since the bottom of the cavity of the core substrate has no opening, the core substrate is susceptible to contraction stress which is generated when a first insulating layer is formed to seal the capacitor, and thus the core substrate is likely to be warped.

SUMMARY

Exemplary embodiments of the invention provide an electronic component built-in substrate having a novel structure in which it is possible to mount an electronic component in a cavity of a core substrate with high reliability, and an electronic component device.

An electronic component built-in substrate according to an exemplary embodiment, comprises:
a core substrate;
a cavity formed on an upper surface side of the core substrate;
a bottom plate of the cavity formed integrally with the core substrate;
a through-hole formed in the bottom plate;
a component mounting portion formed at a portion of the bottom plate;
an electronic component mounted on the component mounting portion so as to be disposed inside the cavity;
a first insulating layer formed on an upper surface of the core substrate so as to cover an upper surface of the electronic component; and
a second insulating layer formed on a lower surface of the core substrate so as to fill the through-hole and cover a lower surface of the electronic component,
wherein,
the cavity is filled with the first insulating layer and the second insulating layer, and
the first insulating layer and the second insulating layer are formed of the same insulating resin.

A method of manufacturing an electronic component built-in substrate, according to an exemplary embodiment, comprises:
preparing a core substrate;
forming a cavity in an upper surface of the core substrate such that the cavity has a plurality of through-holes formed in a bottom plate, and a component mounting portion formed at a portion of the bottom plate between the plurality of through-holes, by processing the core substrate;
mounting an electronic component on the component mounting portion so as to be disposed inside the cavity; and
forming a second insulating layer on a lower surface of the core substrate so as to fill the through-holes and cover a lower surface of the electronic component while forming a first insulating layer on an upper surface of the core substrate so as to cover the upper surface of the electronic component,
wherein the first insulating layer and the second insulating layer are formed of the same insulating resin.

According to the following disclosure, in the electronic component built-in substrate, on the upper surface side of the core substrate, the cavity is formed. In the bottom plate of the cavity, the plurality of through-holes is formed, and the portion of the bottom plate disposed between the through-holes constitutes the component mounting portion.

Further, the electronic component is mounted on the component mounting portion so as to be disposed inside the cavity. Also, on the upper surface of the core substrate, the first insulating layer is formed so as to cover the upper surface of the electronic component. Further, on the lower surface of the core substrate, the second insulating layer is formed so as to fill the through-holes and cover the lower surface of the electronic component.

Therefore, the structure of an area around the electronic component in the thickness direction becomes a substantially symmetric structure with respect to the electronic component. Therefore, during a heating process, even if thermal stress is caused by a difference in the coefficient of thermal expansion between elements, the thermal stress is offset, whereby warpage of the core substrate is prevented.

Also, since the bottom of the cavity of the core substrate has openings, contraction stress which is generated when the first insulating layer and the second insulating layer are formed so as to seal the electronic component is distributed. Therefore, warpage of the core substrate is prevented.

Also, since the component mounting portion is provided at the bottom of the cavity of the core substrate, it is unnecessary to use a method of temporarily sticking an electronic component to adhesive tape and then mounting the electronic component inside the cavity. Therefore, the manufacturing process is easy, and it is possible to reduce the manufacturing cost.

DETAILED DESCRIPTION

Hereinafter, embodiments will be described with reference to the accompanying drawings.

Prior to a description of embodiments, a preliminary technology underlying them will be described. A description of the preliminary technology includes the contents of unknown novel technologies as the contents of personal examination of the inventor.

Figure 1:
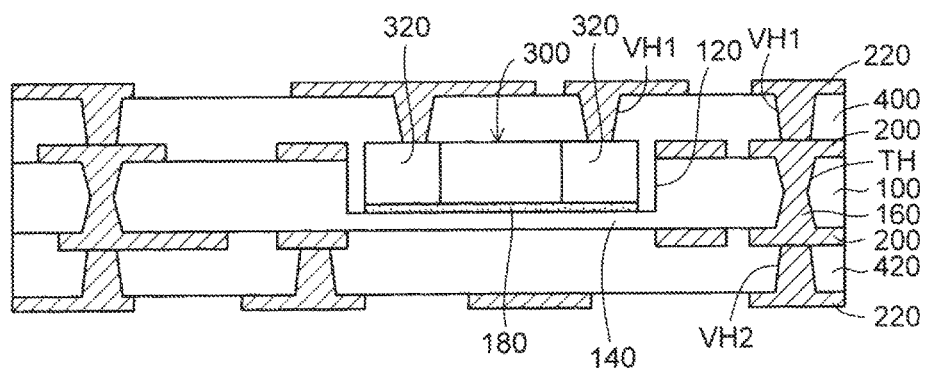
FIG. 1 is a cross-sectional view illustrating an electronic component built-in substrate according to a preliminary technology.

FIG. 1 is a cross-sectional view illustrating an electronic component built-in substrate according to the preliminary technology. The electronic component built-in substrate according to the preliminary technology includes a core substrate 100 disposed at the center portion in the thickness direction. In a front surface of the core substrate 100, a cavity 120 is formed. The cavity 120 is formed at a predetermined depth in the thickness direction of the core substrate 100, whereby a bottom plate portion 140 remains over the whole of the bottom of the cavity 120.

In the core substrate 100, through-holes TH are formed in the thickness direction. Also, on both surfaces of the core substrate 100, first wiring layers 200 are formed, respectively. The first wiring layers 200 of both surface sides are connected to each other by via-conductors 160 formed inside the through-holes TH of the core substrate 100.

Also, on the bottom plate portion 140 of the cavity 120 of the core substrate 100, a capacitor 300 is fixed by an adhesive 180. The capacitor 300 has connection terminals 320 on both end sides.

On the upper surface side of the core substrate 100, a first insulating layer 400 is formed so as to cover the capacitor 300. In the first insulating layer 400, first via holes VH1 are formed so as to reach the connection terminals 320 of the capacitor 300 and the upper first wiring layer 200.

Further, on the first insulating layer 400, a second wiring layer 220 is formed. The second wiring layer 220 is connected to the connection terminals 320 of the capacitor 300 and the first wiring layers 200 by via-conductors formed inside the first via holes VH1.

Also, on the lower surface side of the core substrate 100, a second insulating layer 420 is formed, and second via holes VH2 are formed in the second insulating layer so as to reach the lower first wiring layers 200. On the second insulating layer 420 of the lower surface side of the core substrate 100, a second wiring layer 220 is formed. The second wiring layer 220 of the lower surface side of the core substrate 100 is connected to the first wiring layers 200 by via-conductors formed inside the second via holes VH2.

In the electronic component built-in substrate shown in FIG. 1, the upper surface and side surfaces of the capacitor 300 contact on the first insulating layer 400, and the lower surface of the capacitor 300 contacts on the adhesive 180. Like this, on the upper surface and lower surface of the capacitor 300, different insulating resin materials are disposed.

Also, since the capacitor 300 is fixed on the bottom plate portion 140 of the cavity 120 of the core substrate 100 by the adhesive 180, the capacitor is isolated from the second insulating layer 420 positioned below the capacitor by the bottom plate portion 140.

Therefore, the structure of an area around the capacitor 300 in the thickness direction is asymmetric with respect to the capacitor 300. Therefore, during a heating process, if thermal stress is generated due to a difference in the coefficient of thermal expansion between elements, warpage of the substrate is likely to be caused by the thermal stress.

Also, the bottom of the cavity 120 of the core substrate 100 has no opening. Therefore, the core substrate is susceptible to contraction stress which is generated when the first insulating layer 400 is formed so as to seal the capacitor 300, and thus the core substrate 100 is likely to be warped.

According to an electronic component built-in substrate according to an embodiment to be described below, it is possible to solve the above-described problem.

EMBODIMENT

Figure 14:
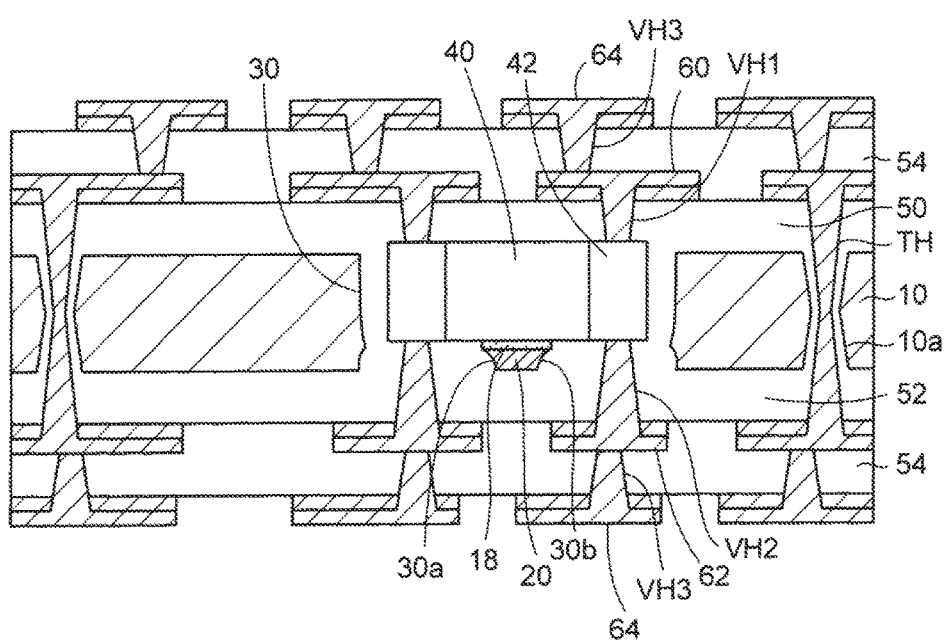
FIG. 14 is a cross-sectional view illustrating an eleventh portion of the method of manufacturing the electronic component built-in substrate according to the embodiment.
Figure 15:
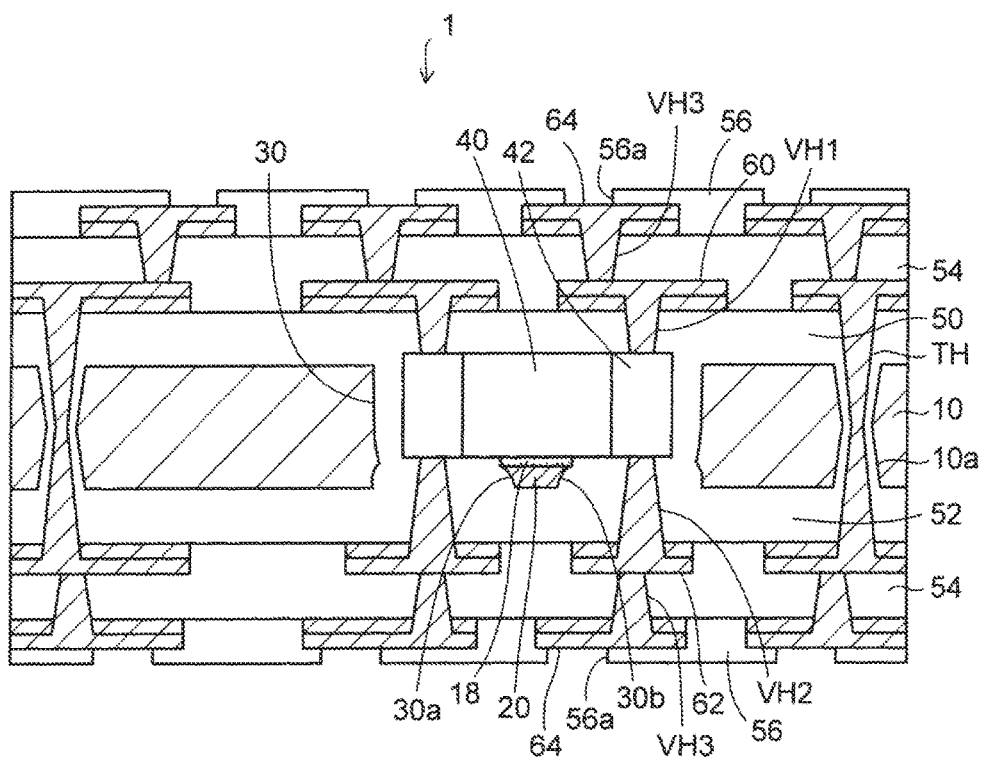
FIG. 15 is a cross-sectional view illustrating the electronic component built-in substrate according to the embodiment.

FIGS. 2A to 14 are views for explaining a method of manufacturing an electronic component built-in substrate according to an embodiment, and FIG. 15 is a view illustrating the electronic component built-in substrate according to the embodiment. Hereinafter, with a description of the method of manufacturing the electronic component built-in substrate, the structure of the electronic component built-in substrate and the structure of an electronic component device will be described.

Figure 2A:
FIGS. 2A and 2B are cross-sectional views illustrating a first portion of a method of manufacturing an electronic component built-in substrate according to an embodiment.

In the method of manufacturing the electronic component built-in substrate according to the embodiment, first, as shown in FIG. 2A, a metal core substrate 10 is prepared. The metal core substrate 10 is formed of a metal plate of copper, aluminum, or the like. The thickness of the metal core substrate 10 is, for example, 100 µm.

In the present embodiment, in order to impart high heat dissipation performance to the electronic component built-in substrate, the metal core substrate 10 is taken as an example of a core substrate. However, in a case where it is unnecessary to consider heat dissipation performance, core substrates composed of insulating resins, glass cloth, and so on may also be used.

Figure 2B:
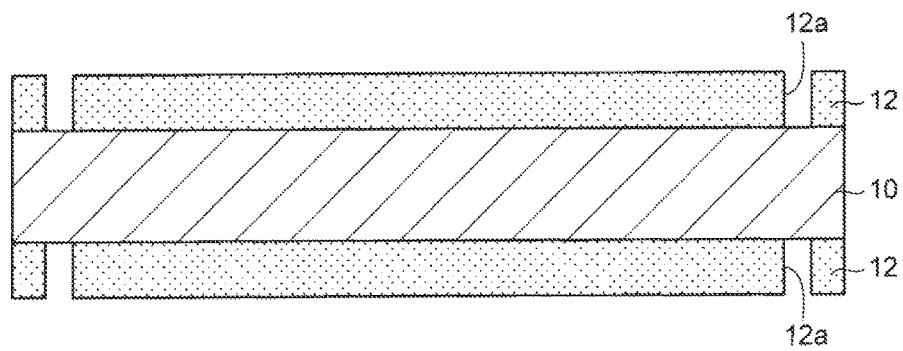

Subsequently, as shown in FIG. 2B, on both surfaces of the metal core substrate 10, resist layers 12 are patterned on the basis of photolithography. The resist layers 12 are formed so as to have openings 12a at portions corresponding to through-hole formation portions of the metal core substrate 10.

Figure 3A:
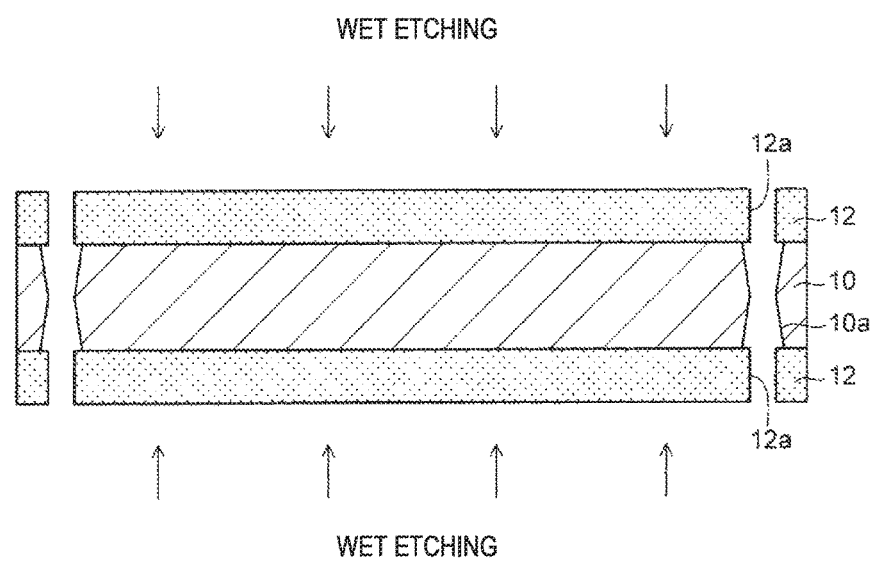
FIGS. 3A and 3B are cross-sectional views illustrating a second portion of the method of manufacturing the electronic component built-in substrate according to the embodiment.

Subsequently, as shown in FIG. 3A, the metal core substrate 10 is etched from both surface sides in the thickness direction through the openings 12a of the resist layers 12 of the both surface sides by wet etching, specifically, spray etching.

If etching surfaces progressing from the openings 12a of the upper resist layer 12 and etching surfaces progressing from the openings 12a of the lower resist layer 12 join, through-holes are formed in the metal core substrate 10. In this way, through-holes 10a are formed in the metal core substrate 10 in the thickness direction.

In a case where the metal core substrate 10 is formed of copper, as an etchant for copper, a cupric chloride solution or a ferric chloride solution can be used.

Figure 3B:

Thereafter, as shown in FIG. 3B, the resist layers 12 are removed from both surfaces of the metal core substrate 10.

Figure 4A:
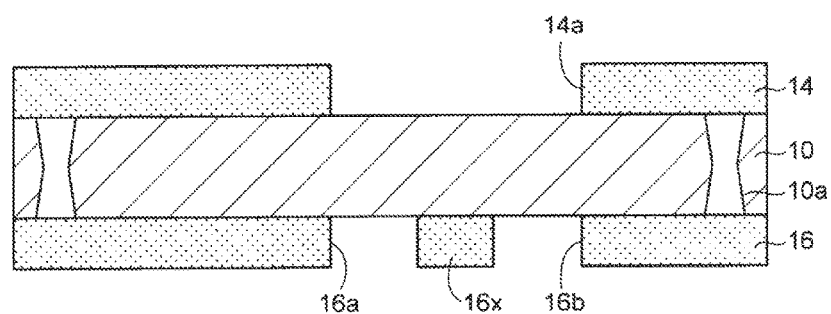
FIGS. 4A and 4B are a cross-sectional view and a plan view illustrating a third portion of the method of manufacturing the electronic component built-in substrate according to the embodiment.

Subsequently, as shown in FIG. 4A, on the upper surface of the metal core substrate 10, a first resist layer 14 is patterned on the basis of photolithography. The first resist layer 14 is formed so as to have an opening 14a at a portion corresponding to a cavity formation portion of the metal core substrate 10.

Further, similarly, as shown in FIG. 4A, on the lower surface of the metal core substrate 10, a second resist layer 16 is patterned on the basis of photolithography.

Figure 4B:
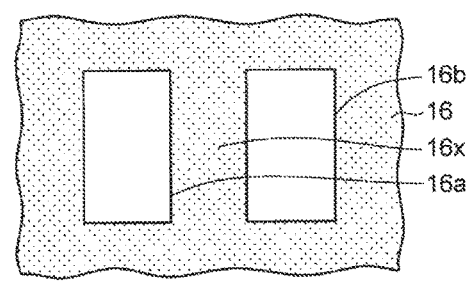

FIG. 4B is a partial plan view illustrating the pattern of the second resist layer 16 as seen from below. Referring to FIG. 4B with FIG. 4A, the pattern of the second resist layer 16 is formed so as to have a first opening 16a and a second opening 16b in an area corresponding to the opening 14a of the first resist layer 14 in a state where the first and second openings are separated from each other.

The first opening 16a and the second opening 16b are separated by a partition portion 16x disposed therebetween, and both ends of the partition portion 16x are connected to the main body of the second resist layer 16.

The first opening 16a and the second opening 16b of the second resist layer 16 are disposed at portions corresponding to through-hole formation portions of the bottom plate portion of the cavity of the metal core substrate 10.

Figure 5A:
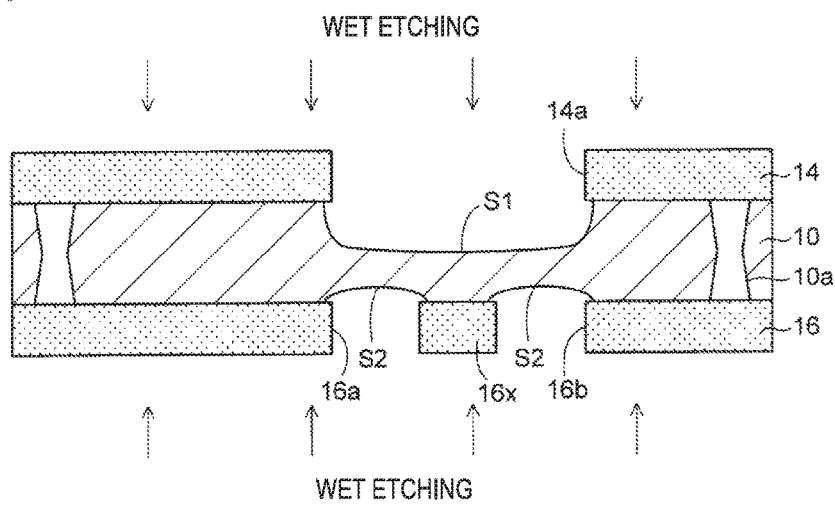
FIGS. 5A and 5B are a cross-sectional view and a plan view illustrating a fourth portion of the method of manufacturing the electronic component built-in substrate according to the embodiment.

Subsequently, as shown in FIG. 5A, the metal core substrate 10 is etched from both surface sides through the opening 14a of the first resist layer 14 and the first and second openings 16a and 16b of the second resist layer 16 by wet etching.

As described above, the metal core substrate 10 is etched from both surface sides by wet etching using the first resist layer 14 and the second resist layer 16 as masks, respectively.

At this time, the wet etching is performed by spray etching, and an etching rate for the upper surface side of the metal core substrate 10 is set to be higher than an etching rate for the lower surface side.

FIG. 5A shows a state in the middle of the wet etching, and an etching surface S1 from the upper surface side of the metal core substrate 10 progresses downward, and etching surfaces S2 from the lower surface side progresses upward.

Figure 5B:
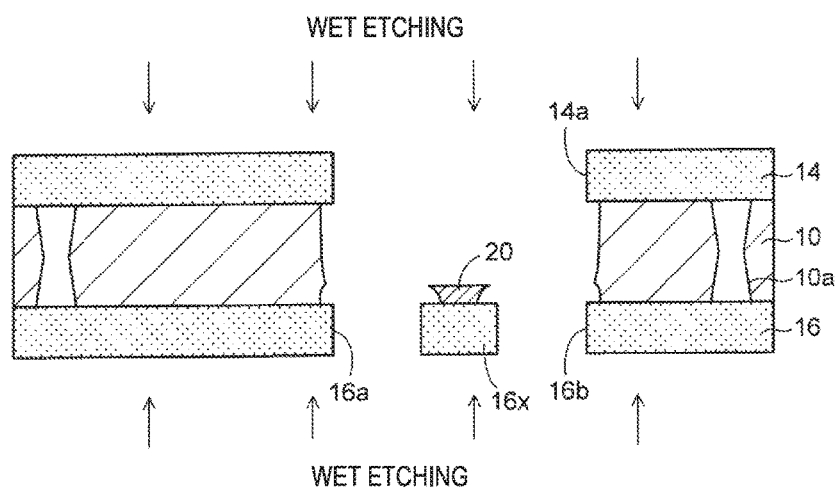

Further, if the etching progresses, the etching surface S1 of the upper surface side of the metal core substrate 10 and the etching surfaces S2 of the lower surface side join at a lower portion of the metal core substrate 10 as shown in FIG. 5B. As a result, through-holes are formed in an area of the metal core substrate 10 positioned above the first opening 16a and the second opening 16b of the second resist layer 16.

Meanwhile, in an area of the metal core substrate 10 having the partition portion 16x of the second resist layer 16 disposed thereon, the metal core substrate 10 is not etched from the lower surface side, and is etched only from the upper surface of the metal core substrate 10. Therefore, on the upper surface of the partition portion 16x of the second resist layer 16, a thin plate portion of the metal core substrate 10 is left as a component mounting portion 20.

By processing the metal core substrate 10 as described above, a cavity 30 is formed in the upper surface of the metal core substrate 10 so as to have a plurality of through-holes 30a and 30b formed in the bottom plate and have the component mounting portion 20 composed of a portion of the bottom plate disposed between the plurality of through-holes 30a and 30b.

Figure 6A:
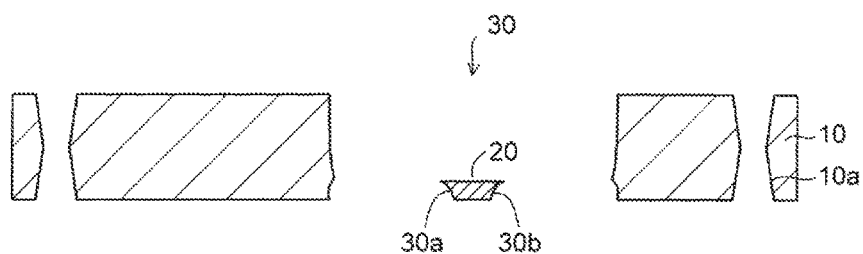
FIGS. 6A to 6C are cross-sectional views and a plan view illustrating a fifth portion of the method of manufacturing the electronic component built-in substrate according to the embodiment.

FIG. 6A shows a state immediately after the first resist layer 14 and the second resist layer 16 have been removed from the metal core substrate 10 of FIG. 5B.

In the above-described way, the cavity 30 is formed on the front surface side of the metal core substrate 10 as shown in FIG. 6A.

Figure 6B:
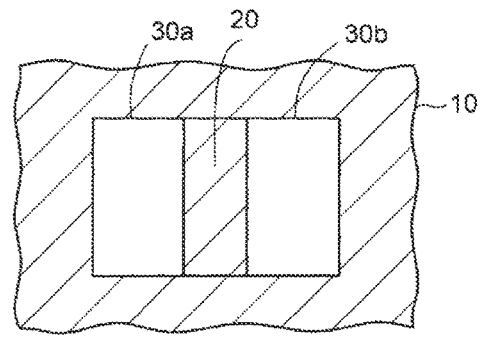

FIG. 6B is a partial plan view of the cavity 30 of the metal core substrate 10 of FIG. 6A as seen from above.

Referring to FIG. 6B with FIG. 6A, the cavity 30 is formed in a quadrangle shape as seen in a plan view. On both end sides of the bottom plate of the cavity 30, two through-holes, that is, the first through-hole 30a and the second through-hole 30b are formed separately. The portion of the bottom plate positioned between the first through-hole 30a and the second through-hole 30b constitutes the component mounting portion 20.

The component mounting portion 20 is disposed in a stripe shape at the central portion of the cavity 30 so as to separate the first through-hole 30a and the second through-hole 30b. Also, the component mounting portion 20 is composed of the thin plate portion of the metal core substrate 10, and both ends thereof in the longitudinal direction are connected to and supported on the lower end portion of the metal core substrate 10 in the thickness direction.

As described above, the component mounting portion 20 is at the center of the bottom of the cavity 30, and the first through-hole 30a and the second through-hole 30b formed in the bottom plate of the cavity 30 are on both sides of the component mounting portion 20.

In a case where the thickness of the metal core substrate 10 is 100 µm, the thickness of the component mounting portion 20 is set to 10 µm to 20 µm.

If the cavity 30 having the above-described structure is used, as will be described below, it is possible to seal the upper surface and lower surface of the electronic component mounted on the component mounting portion 20 with the same insulating resin such that those surfaces contact on the insulating resin. Therefore, it is possible to reduce asymmetry.

Figure 6C:
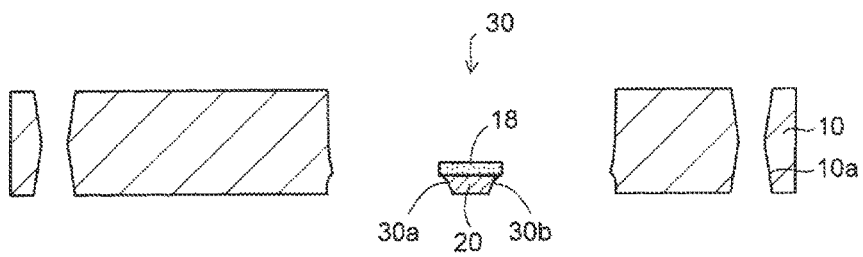

Subsequently, on the component mounting portion 20, an adhesive 18 is provided as shown in FIG. 6C. Meanwhile, as shown in FIG. 7, a capacitor 40 is prepared. The capacitor 40 has connection terminals 42 on both end sides in the horizontal direction. The capacitor 40 is an example of the electronic component.

The connection terminals 42 of both end sides of the capacitor 40 are formed such that they cover the main body of the capacitor 40 from the end portions of the upper surface to the end portions of the lower surface and the upper surfaces and lower surfaces of the connection terminal 42 can be connected to wiring layers.

As the capacitor 40, preferably, a stacked ceramic chip capacitor having a stacked structure of a plurality of layers such as a dielectric layer and internal electrodes can be used. In this case, the connection terminals 42 of FIG. 7A are connected to ends of the internal electrodes of the stacked structure.

Subsequently, the capacitor 40 is fixed on the component mounting portion 20 in the cavity 30 of the metal core substrate 10 by the adhesive 18.

Figure 7A:
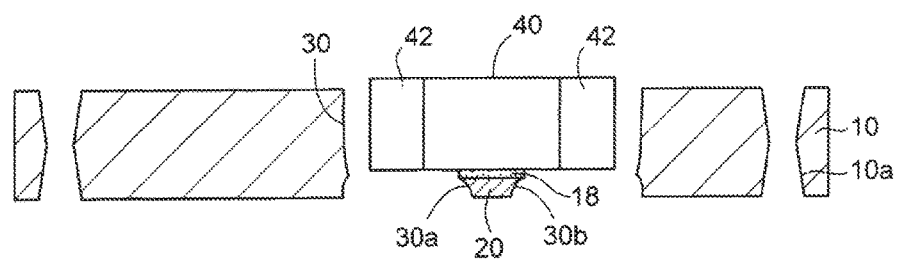
FIGS. 7A and 7B are a cross-sectional view and a plan view illustrating a sixth portion of the method of manufacturing the electronic component built-in substrate according to the embodiment.
Figure 7B:
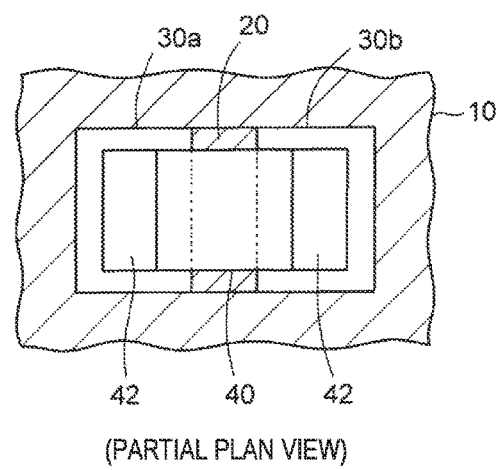

Referring to a partial plan view of FIG. 7B with FIG. 7A, at that time, the central portion of the capacitor 40 is disposed on the component mounting portion 20 with the adhesive 18 interposed therebetween, and the connection terminals 42 of both end sides of the capacitor 40 are aligned with and positioned above the first through-hole 30a and the second through-hole 30b.

As described above, the capacitor 40 is mounted on the component mounting portion 20 such that the connection terminals 42 of the capacitor 40 do not come into contact with the metal core substrate 10. In this way, the capacitor 40 is mounted so as to be electrically insulated from the metal core substrate 10.

In the cavity 30 of FIG. 7B described as an example, two through-holes, that is, the first through-hole 30a and the second through-hole 30b are disposed side by side in the horizontal direction, and the component mounting portion 20 is disposed between them. However, it is also possible to dispose two or more structures each of which having two or more through-holes side by side in the horizontal direction, in the vertical direction, side by side, and mount two or more capacitors in the vertical direction, side by side.

As described above, it is needed only to form a plurality of through-holes in the bottom plate of the cavity 30, and use a portion of the bottom plate disposed between the plurality of through-holes, as a component mounting portion.

Figure 8:
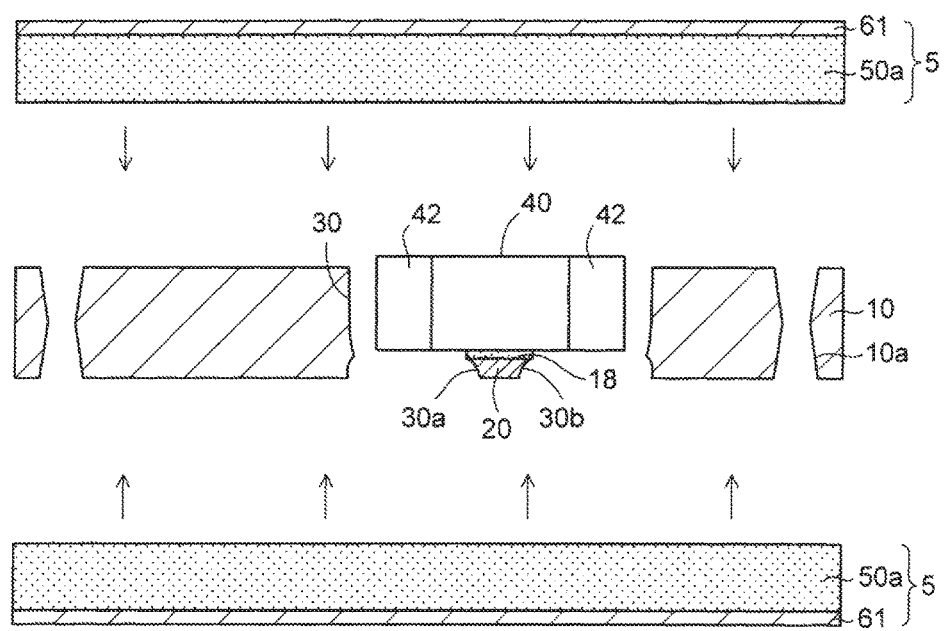
FIG. 8 is a cross-sectional view illustrating a seventh portion of the method of manufacturing the electronic component built-in substrate according to the embodiment.

Subsequently, resin films 5 having copper foil stuck thereon are prepared. Each of the resin films 5 has a resin film 50a, and copper foil 61 stuck to one surface of the resin film 50a as shown in FIG. 8. As the resin film 50a, preferably, prepreg can be used. Prepreg is a material produced by impregnating a reinforcing fiber material such as glass cloth or carbon fiber with a thermosetting resin such as an epoxy resin and hardening the thermosetting resin.

Subsequently, on both surface sides of the structure of FIG. 7A, the surfaces of the resin films 50a of the resin films 5 having the copper foil stuck thereon are stuck by thermocompression.

Figure 9A:
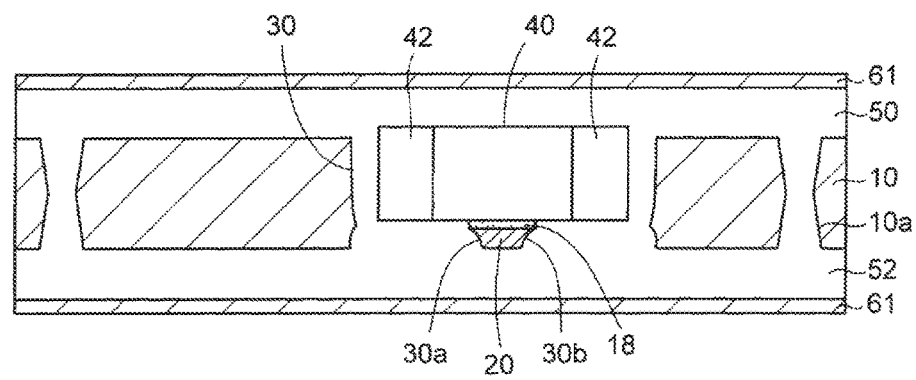
FIGS. 9A and 9B are cross-sectional views illustrating an eighth portion of the method of manufacturing the electronic component built-in substrate according to the embodiment.

Therefore, the resin film 50a of the upper surface side of the metal core substrate 10 is cured by the heating process, thereby constituting a first insulating layer 50 as shown in FIG. 9A. At the same time, the resin film 50a of the lower surface side of the metal core substrate 10 is cured by the heating process, thereby constituting a second insulating layer 52.

On the metal core substrate 10 and the capacitor 40, the first insulating layer 50 is formed. The first insulating layer 50 is formed so as to contact on the upper surface of the capacitor 40. Also, the first insulating layer 50 is formed in a state where it has the copper foil 61 stuck to the outer surface.

Also, similarly, on the lower side of the metal core substrate 10 and the capacitor 40, the second insulating layer 52 is formed. The second insulating layer 52 is formed so as to contact on the lower surface of the capacitor 40 inside the first through-hole 30a and the second through-hole 30b of the cavity 30. Also, the second insulating layer 52 is formed in a state where it has the copper foil 61 stuck to the outer surface.

In the above-described way, the cavity 30 is filled with the first insulating layer 50 and the second insulating layer 52.

The first insulating layer 50 and the second insulating layer 52 are filled in the area between the inner wall of the cavity 30 of the metal core substrate 10 and the side surface of the capacitor 40, and the through-holes 10a. The first insulating layer 50 and the second insulating layer 52 are integrally formed of the same insulating resin material.

As described above, the first insulating layer 50 and the second insulating layer 52 which are composed of the same insulating resin are formed on the upper surface and lower surface of the capacitor 40 so as to contact on those surfaces. Therefore, the structure of an area around the capacitor 40 in the thickness direction becomes a subsequently symmetric structure with respect to the capacitor 40.

Figure 9B:
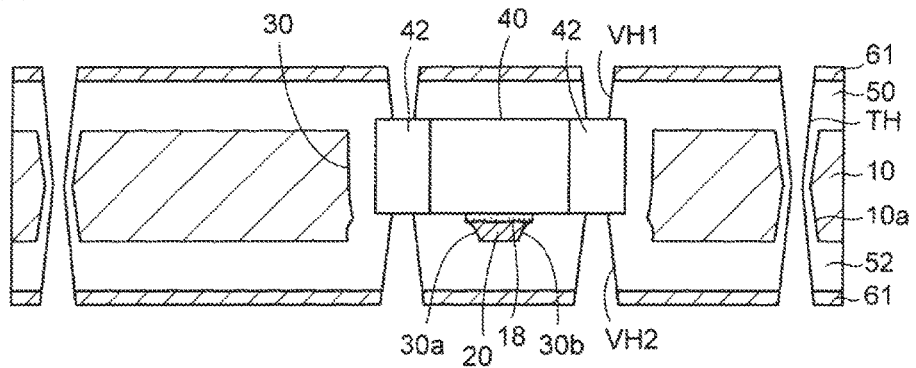

Subsequently, laser processing is performed on portions of the upper copper foil 61 and the first insulating layer 50 positioned on the connection terminals 42 of the capacitor 40 as shown in FIG. 9B. As a result, first via holes VH1 are formed in the first insulating layer 50 and the copper foil 61 of the upper surface side of the metal core substrate 10 so as to reach the upper surfaces of the connection terminals 42 of the capacitor 40.

Also, laser processing is performed on portions of the lower copper foil 61 and the second insulating layer 52 positioned below the connection terminals 42 of the capacitor 40. As a result, second via holes VH2 are formed in the second insulating layer 52 and the copper foil 61 positioned on the lower surface side of the metal core substrate 10 so as to reach the lower surfaces of the connection terminals 42 of the capacitor 40.

Also, laser processing is performed on the copper foil 61 and the first insulating layer 50 of the upper surface side of the metal core substrate 10, such that holes are formed inside the through-holes 10a. Also, at the same time, laser processing is performed on the copper foil 61 and the second insulating layer 52 of the lower surface side of the metal core substrate 10, such that holes are formed inside the through-holes 10a.

Then, the processing surfaces from the upper side and the processing surfaces from the lower side join inside the through-holes 10a of the metal core substrate 10, whereby through-hole TH are formed.

At this time, the first insulating layer 50 and the second insulating layer 52 remain on the inner walls of the through-holes 10a of the metal core substrate 10, and thus the metal core substrate 10 and the insides of the through-hole TH are electrically insulated from each other.

Figure 10A:
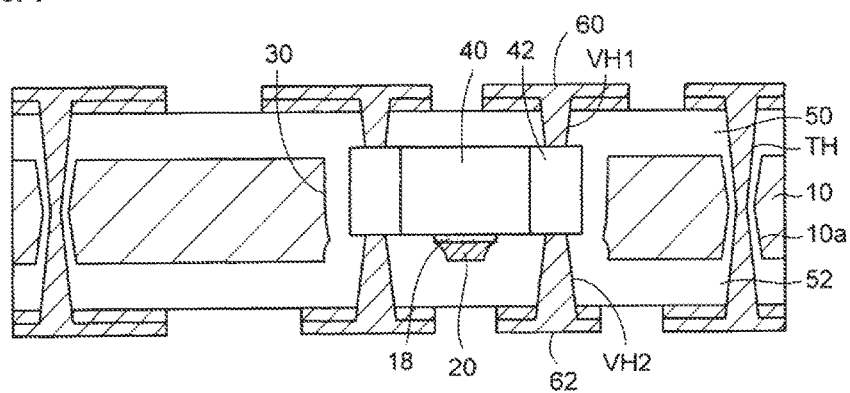
FIGS. 10A and 10B are cross-sectional views illustrating a ninth portion of the method of manufacturing the electronic component built-in substrate according to the embodiment.

Subsequently, on the first insulating layer 50 of the upper surface side of the metal core substrate 10, a first wiring layer 60 is formed using the upper copper foil 61 as shown in FIG. 10A. The first wiring layer 60 of the upper surface side of the metal core substrate 10 is connected to the upper surfaces of the connection terminals 42 of the capacitor 40 by via-conductors formed inside the first via holes VH1.

At the same time, on the second insulating layer 52 of the lower surface side of the metal core substrate 10, a second wiring layer 62 is formed using the lower copper foil 61. The second wiring layer 62 of the lower surface side of the metal core substrate 10 is connected to the lower surfaces of the connection terminals 42 of the capacitor 40 by via-conductors formed inside the second via holes VH2.

Also, the first wiring layer 60 of the upper surface side is connected to the second wiring layer 62 of the lower surface side by via-conductors formed inside the through-hole TH passing through the insides of the through-holes 10a of the metal core substrate 10.

In the example of the present embodiment, the first wiring layer 60 and the second wiring layer 62 are formed by a process called MSAP (Modified Semi-Additive Process).

Figure 11A:
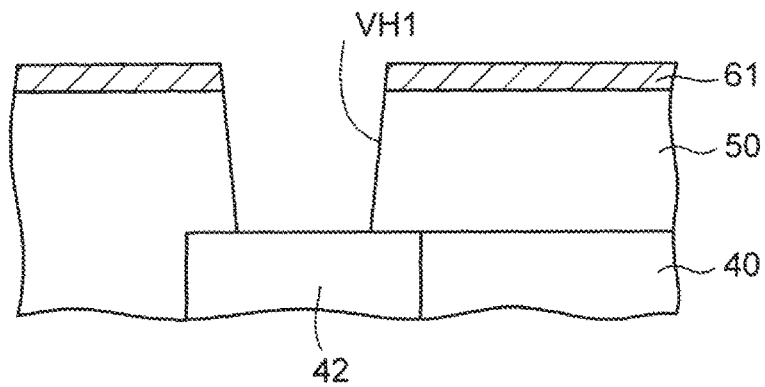
FIGS. 11A to 11C are cross-sectional views illustrating a first portion of a method of forming a first wiring layer of FIG. 10A.
Figure 11B:
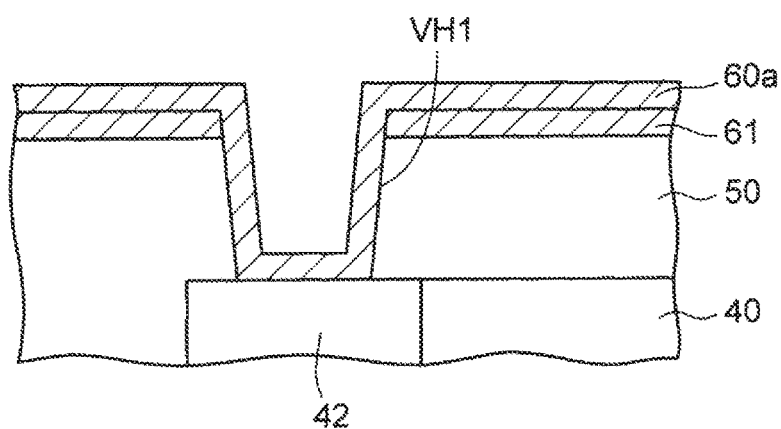

FIG. 11A is a partial enlarged view illustrating an area around a first via hole VH1 formed on the left connection terminal 42 of the capacitor 40 of FIG. 9B described above. Specifically, first, a seed layer 60a is formed on the inner walls of the first via holes VH1 and the upper copper foil 61 as shown in FIGS. 11A and 11B by electroless plating.

Figure 11C:
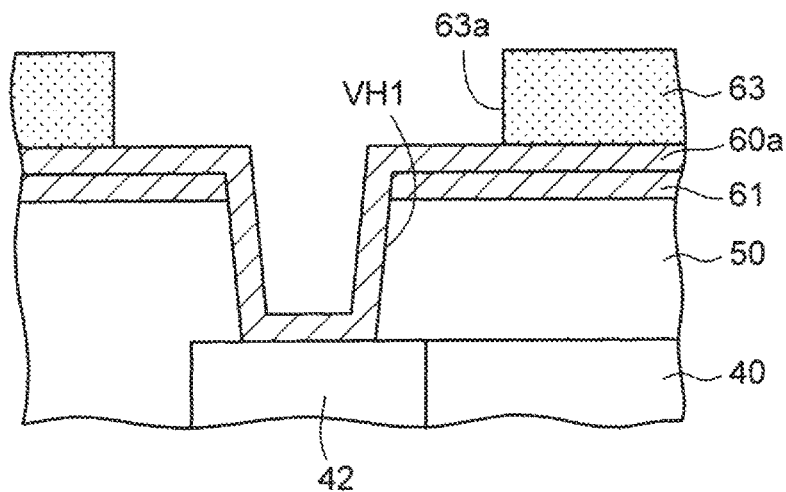

Subsequently, a resist coating layer 63 is formed so as to have openings 63a at areas for forming the first wiring layer 60, as shown in FIG. 11C.

Figure 12A:
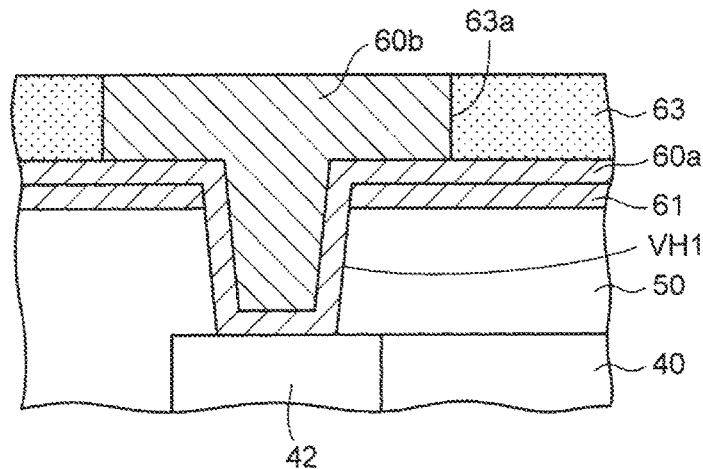
FIGS. 12A and 12B are cross-sectional views illustrating a second portion of the method of forming the first wiring layer of FIG. 10A.

Subsequently, a metal coating layer 60b is formed by performing plating on the seed layer 60a and the upper copper foil 61, so as to fill the first via holes VH1 and the openings 63a of the resist coating layer 63 as shown in FIG. 12A. The seed layer 60a and the metal coating layer 60b are formed of copper or the like.

Figure 12B:
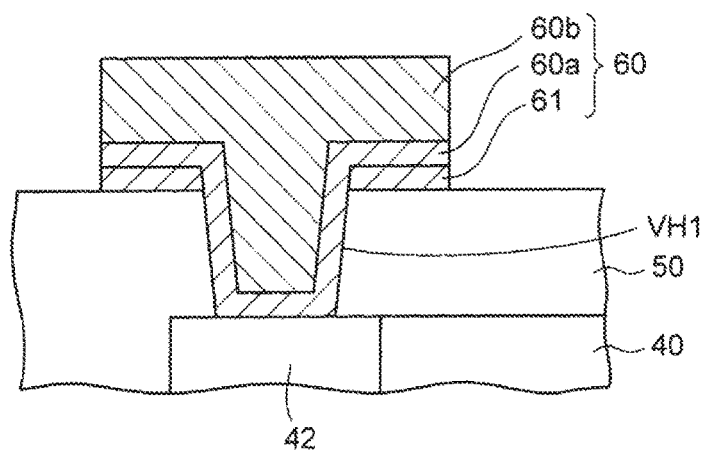
Figure 13:
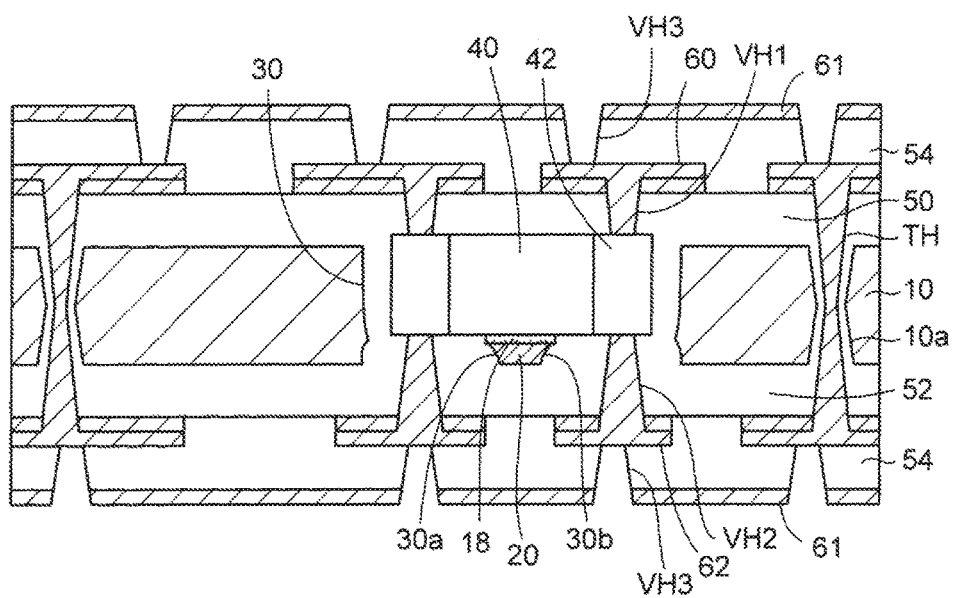
FIG. 13 is a cross-sectional view illustrating a tenth portion of the method of manufacturing the electronic component built-in substrate according to the embodiment.

Subsequently, as shown in FIG. 12B, the resist coating layer 63 is removed, and then the seed layer 60a and the upper copper foil 61 are etched using the metal coating layer 60b as a mask.

In the above-described way, the first wiring layer 60 is formed from the upper copper foil 61, the seed layer 60a, and the metal coating layer 60b.

The upper copper foil 61 for the first wiring layer 60 is not formed inside the first via holes VH1, and is formed only on the first insulating layer 50. Meanwhile, the seed layer 60a for the first wiring layer 60 is formed so as to cover the bottoms and inner walls of the first via holes VH1 and the upper surface of the upper copper foil 61.

At the same time as formation of the first wiring layer, a second wiring layer 62 is formed on the second insulating layer 52 of the lower surface side of the metal core substrate 10 as shown in FIG. 10A. At this time, via-conductors are formed inside the through-hole TH so as to connect the first wiring layer 60 of the upper surface side and the second wiring layer 62 of the lower surface side, as shown in FIG. 10A.

In the process of FIG. 12A described above, when the metal coating layer 60b is formed, the metal coating layer 60b fills the through-hole TH so as to form the via-conductors.

In FIGS. 10A and 10B, and FIGS. 13 to 16 to be described below, the seed layer 60a of the first wiring layer 60 of FIG. 12B are not shown.

As the method of forming the first wiring layer 60 and the second wiring layer 62, a semi-additive method may be used. In this case, in the processes of FIGS. 8 and 9A described above, a resin film 50a without any copper foil 61 is used. Therefore, in FIG. 12B described above, the copper foil 61 is eliminated from the first wiring layer 60. Consequently, the first wiring layer 60 is composed of the seed layer 60a, and the metal coating layer 60b formed on the seed layer.

Alternatively, the first wiring layer 60 may be formed by a subtractive method.

Figure 10B:
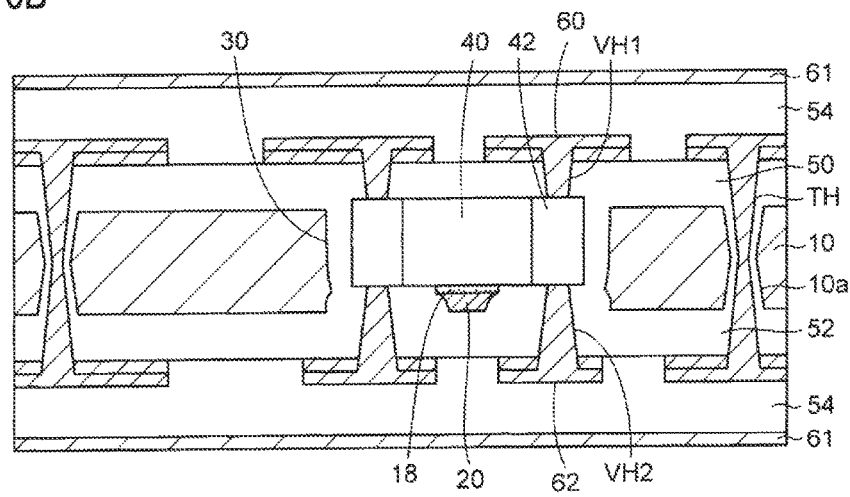

Subsequently, on both surface sides of the structure of FIG. 10A, third insulating layers 54 each of which has copper foil 61 stuck to an outer surface are formed, respectively, as shown in FIG. 10B, by the same method as the process of FIGS. 8 and 9A described above.

A third insulating layer 54 is formed on the first insulating layer 50 and the first wiring layer 60 of the upper surface side of the metal core substrate 10. Also, at the same time, an third insulating layer 54 is formed on the second insulating layer 52 and the second wiring layer 62 of the lower surface side of the metal core substrate 10.

Subsequently, laser processing is performed on the upper copper foil 61, the lower copper foil 61, and the third insulating layers 54 of both surface sides of the metal core substrate 10. As a result, third via holes VH3 are formed in the third insulating layer 54 of the upper surface side of the metal core substrate 10, so as to reach connection portions of the first wiring layer 60. Also, at the same time, third via holes VH3 are formed in the third insulating layer 54 of the lower surface side of the metal core substrate 10, so as to reach connection portions of the second wiring layer 62.

Subsequently, on the third insulating layer 54 of the upper surface side of the metal core substrate 10, a third wiring layer 64 is formed so as to be connected to the connection portions of the first wiring layer 60 through the third via holes VH3, as shown in FIG. 14. Also, at the same time, on the third insulating layer 54 of the lower surface side of the metal core substrate 10, a third wiring layer 64 is formed so as to be connected to the connection portions of the second wiring layer 62 through the third via holes VH3.

The second wiring layers 62 on both surface sides are formed by the same method as the method of forming the first wiring layers 60 described above with reference to FIGS. 11A to 12B. Similarly, a semi-additive method or a subtractive method may be used.

Subsequently, on the third insulating layers 54 of both surface sides of the metal core substrate 10, solder resist layers 56 are formed, respectively, so as to have openings 56a at positions corresponding to the connection portions of the third wiring layers 64.

In the above-described way, an electronic component built-in substrate 1 according to the embodiment is manufactured.

As shown in FIG. 15, the electronic component built-in substrate 1 according to the embodiment includes the metal core substrate 10 at the central portion in the thickness direction. As described above with reference to FIGS. 6A and 6B, on the upper surface side of the metal core substrate 10, the cavity 30 is formed. On both end sides of the bottom plate portion of the cavity 30, two through-holes, that is, the first through-hole 30a and the second through-hole 30b are formed. The bottom plate of the cavity 30 is formed integrally with the metal core substrate 10.

The portion of the bottom plate positioned between the first through-hole 30a and the second through-hole 30b constitutes the component mounting portion 20. As seen in a plan view, the cavity 30 is formed in a quadrangle shape, and the component mounting portion 20 is disposed in a stripe shape between the first through-hole 30a and the second through-hole 30b.

The component mounting portion 20 is composed of the thin plate portion of the metal core substrate 10, and is connected to and supported on the lower end portion of the metal core substrate 10 in the thickness direction.

Further, the capacitor 40 is fixed on the component mounting portion 20 of the bottom of the cavity 30 of the metal core substrate 10 by the adhesive 18. The capacitor 40 has the pair of connection terminals 42 on both end sides in the horizontal direction. In this way, the capacitor 40 is disposed inside the cavity 30 of the metal core substrate 10.

As described above with reference to FIG. 7B, the connection terminals 42 of both end sides of the capacitor 40 are disposed so as to overlap the first through-hole 30a and the second through-hole 30b, respectively, as seen in a plan view.

Also, on the upper surfaces of the metal core substrate 10 and the capacitor 40, the first insulating layer 50 is formed. The upper surface of the capacitor 40 is sealed by the first insulating layer 50 so as to contact on the first insulating layer. The first insulating layer 50 covers the upper surface of the capacitor 40.

Also, on the lower surfaces of the metal core substrate 10, the capacitor 40, and the component mounting portion 20, the second insulating layer 52 is formed. The second insulating layer 52 is formed so as to fill the first through-hole 30a and the second through-hole 30b, and the lower surface of the capacitor 40 is sealed by the second insulating layer so as to contact on the second insulating layer. The second insulating layer 52 covers the lower surface of the capacitor 40.

In this way, the cavity 30 is filled with the first insulating layer 50 and the second insulating layer 52.

The upper portion of the area between the inner walls of the cavity 30 and the side surfaces of the capacitor 40 is filled with the first insulating layer 50. The lower portion of the area between the inner walls of the cavity 30 and the side surfaces of the capacitor 40 is filled with the second insulating layer 52.

In this way, the first insulating layer 50 and the second insulating layer 52 are formed integrally with each other, so as to seal the both surfaces and side surfaces of the capacitor 40. The first insulating layer 50 and the second insulating layer 52 are formed of the same insulating resin material.

In the present embodiment, on both end sides of the bottom plate of the cavity 30, two through-holes, that is, the first through-hole 30a and the second through-hole 30b are disposed, without providing a component mounting pad over the whole of the bottom of the cavity 30 of the metal core substrate 10. Further, the portion of the bottom plate portion between the first through-hole 30a and the second through-hole 30b is left as the component mounting portion 20.

In the above-described way, the first insulating layer 50 and the second insulating layer 52 can be formed of the same insulating resin material on the upper surface and lower surface of the capacitor 40 so as to contact on those surfaces, thereby sealing those surfaces.

The portion of the lower surface of the capacitor 40 disposed on the component mounting portion 20 does not contact on the second insulating layer 52, and the structure of the area around the capacitor 40 in the thickness direction becomes a subsequently symmetric structure with respect to the capacitor 40.

Therefore, during a heating process, even if thermal stress is caused by a difference in the coefficient of thermal expansion between elements, the thermal stress is offset, whereby warpage of the core substrate 10 is prevented.

Also, in the bottom plate of the cavity 30, the first and second through-holes 30a and 30b are disposed, and thus the cavity 30 has openings at the bottom. Further, the filling portions of the first insulating layer 50 and the second insulating layer 52 filled between the inner walls of the cavity 30 and the side surfaces of the capacitor 40 are connected to the main bodies of the first insulating layer 50 and the second insulating layer 52 of the upper and lower sides.

As described above, openings are formed in some portions of the bottom of the cavity 30, and the first insulating layer 50 and the second insulating layer 52 are formed of the same insulating resin on the upper surface and the lower surface of the capacitor 40 so as to contact on those surfaces.

In this case, since contraction stress which is generated when the first insulating layer 50 and the second insulating layer 52 is distributed without being concentrated on some portions of the core substrate 10, warpage of the core substrate 10 is prevented.

Meanwhile, in a case where a cavity is formed through the metal core substrate unlike the present embodiment, it is required to temporarily stick the capacitor to adhesive tape, and then dispose the capacitor in the cavity.

Therefore, after an insulating layer is formed on one surface of the capacitor temporarily stuck to the adhesive tape, it is required to peel off the adhesive tape in order to form an insulating layer on the other surface of the capacitor. Therefore, the process becomes complicated.

In the present embodiment, at a portion of the bottom of the cavity 30 of the metal core substrate 10, the component mounting portion 20 is formed. Therefore, it is unnecessary to use adhesive tape for mounting the capacitor 40, and it is possible to form the insulating layers on the upper and lower surface sides of the capacitor 40 at the same time. Therefore, the manufacturing process is easy, and it is possible to reduce the manufacturing cost.

Also, the capacitor 40 is mounted on the component mounting portion 20 composed of the thin plate portion of the metal core substrate 10. Therefore, in a case of mounting an electronic component likely to generate heat, such as a capacitor or a CPU, the main body of the metal core substrate 10 connected to the component mounting portion 20 constitutes a conduction path of heat generated from the electronic component. Therefore, it is possible to dramatically improve the heat dissipation performance of the electronic component built-in substrate.

In a case of using a core substrate composed of an insulating resin, since the wiring paths constitute heat conduction paths, temperature is likely to rise at some portions of the electronic component built-in substrate, resulting in warpage or deformation of the substrate.

Since the metal core substrate 10 is used as a heat conduction path, it is possible to prevent temperature from rising at some portions of the electronic component built-in substrate, and it is possible to prevent warpage or deformation of the substrate. Also, since an increase in electrical resistance attributable to heat generation is prevented, it is possible to avoid deterioration of electrical characteristics attributable to heat generation.

Also, in a case where heat dissipation performance, in place of the metal core substrate 10, core substrates composed of insulating resins such as an epoxy resin, glass cloth, and so on may be used. In a case of using a core substrate composed of an insulating resin, it is possible to form the same cavity by laser processing or router processing.

In the metal core substrate 10 and the first insulating layer 50 of the upper surface side of the capacitor 40, the first via holes VH1 are formed so as to reach the upper surfaces of the connection terminals 42 of the capacitor 40. Also, on the first insulating layer 50 of the upper surface side, the first wiring layer 60 is formed. The first wiring layer 60 of the upper surface side of the metal core substrate 10 is connected to the upper surfaces of the connection terminals 42 of the capacitor 40 by the via-conductors formed inside the first via holes VH1.

In the metal core substrate 10 and the second insulating layer 52 of the lower surface side of the capacitor 40, the second via holes VH2 are formed so as to reach the lower surfaces of the connection terminals 42 of the capacitor 40.

On the second insulating layer 52 of the lower surface side, the second wiring layer 62 is formed. The second wiring layer 62 of the lower surface side is connected to the lower surfaces of the connection terminals 42 of the capacitor 40 by the via-conductors formed inside the second via holes VH2.

Also, the through-hole TH are formed so as to extend from the upper surface of the first insulating layer 50 to the lower surface of the second insulating layer 52 through the through-holes 10a of the metal core substrate 10. On the inner walls of the through-holes 10a of the metal core substrate 10, the first insulating layer 50 and the second insulating layer 52 are left.

Also, the first wiring layer 60 of the upper surface side is connected to the second wiring layer 62 of the lower surface side by the via-conductors formed inside the through-hole TH.

In the present embodiment, on both sides of the component mounting portion 20 having the capacitor 40 mounted thereon, there are the first through-hole 30a and the second through-hole 30b. Therefore, it is possible to connect the second via holes VH2 to the lower surfaces of the connection terminals 42 through the first through-hole 30a and the second through-hole 30b while connecting the first via holes VH1 to the upper surfaces of the connection terminals 42 of the capacitor 40.

In this way, it is possible to connect the second wiring layers 62 not only to the upper surfaces of the connection terminals 42 of the capacitor 40 but also to the lower surfaces of the connection terminals 42. Therefore, it is possible to improve the freedom of electric wiring layout.

Although the capacitor 40 has been taken as an example of the electronic component, various electronic components such as a semiconductor chip and an inductor can be mounted.

In a case of using a semiconductor chip having an element formation area on the front surface side, the rear surface of the semiconductor chip is mounted on the component mounting portion 20 positioned inside the cavity 30 of the metal core substrate 10 with the adhesive 18. Then, in connection pads disposed on the element formation area of the front surface side of the semiconductor chip, via holes are disposed for connection with a wiring layer.

Also, on the first insulating layer 50 of the upper surface side of the metal core substrate 10, the third insulating layer 54 is formed so as to cover the first wiring layer 60. In the third insulating layer 54 of the upper surface side, the third via holes VH3 are formed so as to reach the connection portions of the first wiring layer 60.

On the third insulating layer 54 of the upper surface side, the third wiring layer 64 is formed so as to be connected to the connection portions of the first wiring layer 60 by the via-conductors formed inside the third via holes VH3.

Also, on the second insulating layer 52 of the lower surface side of the metal core substrate 10, the third insulating layer 54 is formed so as to cover the second wiring layer 62. On the third insulating layer 54 of the lower surface side, the third via holes VH3 are formed so as to reach the connection portions of the second wiring layer 62.

On the third insulating layer 54 of the lower surface side, the lower third wiring layer 64 is formed so as to be connected to the connection portions of the second wiring layer 62 by the via-conductors formed inside the third via holes VH3.

Further, on the third insulating layers 54 of both surface sides of the metal core substrate 10, the solder resist layers 56 are formed, respectively, so as to have the openings 56a at positions corresponding to the connection portions of the third wiring layers 64.

Figure 16:
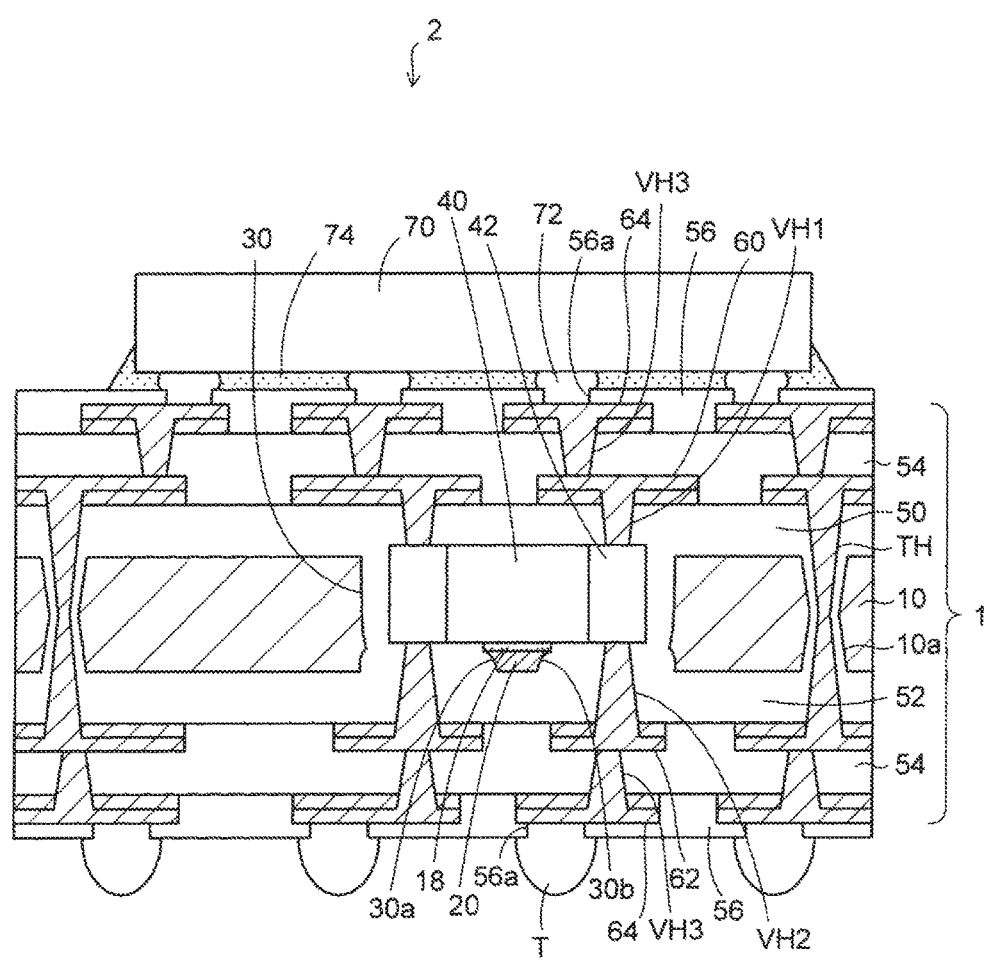
FIG. 16 is a cross-sectional view illustrating an electronic component device of the embodiment.

FIG. 16 shows an electronic component device 2 using the electronic component built-in substrate 1 shown in FIG. 15. As shown in FIG. 16, in the electronic component device 2 of the embodiment, pads of a semiconductor chip 70 are connected to the connection portions of the third wiring layer 64 of the upper surface side of the electronic component built-in substrate 1 shown in FIG. 15 by flip-chip bonding using bump electrodes 72 of solder or the like.

The semiconductor chip 70 is electrically connected to the capacitor 40 by the first wiring layer 60 and the third wiring layer 64.

Further, between the electronic component built-in substrate 1 and the semiconductor chip 70, an underfill resin 74 is filled. The semiconductor chip 70 is, for example, an LSI chip such as a CPU. The capacitor 40 of the electronic component built-in substrate 1 described above is an example of a first electronic component, and the semiconductor chip 70 is an example of a second electronic component.

Further, on the connection portions of the third wiring layer 64 of the lower surface side of the electronic component built-in substrate 1, external connection terminals T which are composed of solder balls are provided.

In the electronic component device 2 of the embodiment, the capacitor 40 embedded in the electronic component built-in substrate 1 functions as a decoupling capacitor disposed between the power supply line and ground line of the semiconductor chip 70. The decoupling capacitor is used to stabilize power supply voltage and reduce high-frequency noise.

As described above, in the electronic component built-in substrate 1, on both sides of the component mounting portion 20 having the capacitor 40 mounted thereon, there are the first through-hole 30a and the second through-hole 30b. Therefore, it is possible to connect wiring lines to the upper surfaces and the lower surfaces of the capacitor 40, and thus it is possible to improve the degree of freedom of decoupling capacitor circuit design.

Also, as described above, the electronic component built-in substrate 1 which is used in the electronic component device 2 of the embodiment includes the metal core substrate 10. Therefore, heat which is radiated from the semiconductor chip 70 is conducted to the metal core substrate 10 through the upper third wiring layer 64, the first wiring layer 60, the capacitor 40, and the component mounting portion 20, and is radiated to the outside.

Although not particularly shown in FIG. 16, dummy pads for heat dissipation may be provided on the semiconductor chip 70, such that the dummy pads are connected directly to the metal core substrate 10 by thermal vias formed through the upper third wiring layer 64 and the first wiring layer 60. In this case, since the heat condition path does not include the capacitor 40, it is possible to further improve heat dissipation performance.

This disclosure further encompasses various exemplary embodiments, for example, described below.

1. A method of manufacturing an electronic component built-in substrate, comprising:
   preparing a core substrate;
   forming a cavity in an upper surface of the core substrate such that the cavity has a plurality of through-holes formed in a bottom plate, and a component mounting portion formed at a portion of the bottom plate between the plurality of through-holes, by processing the core substrate;
   mounting an electronic component on the component mounting portion so as to be disposed inside the cavity; and
   forming a second insulating layer on a lower surface of the core substrate so as to fill the through-holes and cover a lower surface of the electronic component while forming a first insulating layer on an upper surface of the core substrate so as to cover the upper surface of the electronic component,
   wherein the first insulating layer and the second insulating layer are formed of the same insulating resin.

2. The method of manufacturing an electronic component built-in substrate according to claim 1, wherein:
   in the forming the cavity in the core substrate,
      the cavity is formed in a quadrangle shape as seen in a plan view;
      on both sides of the bottom plate of the cavity, two through-holes are disposed, and
      at a central portion of the cavity, the component mounting portion is disposed, and
   in the mounting the electronic component,
      the electronic component is a capacitor having connection terminals on both end sides,
      the central portion of the capacitor is fixed on the component mounting portion, and
      the connection terminals of both end sides of the capacitor are disposed at positioned above the two through-holes.

3. The method of manufacturing an electronic component built-in substrate according to claim 1 or 2, further comprising:
   after the forming the first insulating layer and the second insulating layer,
      forming via holes in the second insulating layer so as to reach lower surfaces of the connection terminals of the electronic component through the through-holes; and
      forming a wiring layer on a lower surface of the second insulating layer so as to be connected to the lower surfaces of the connection terminals of the electronic component through the via holes.

4. The method of manufacturing an electronic component built-in substrate according to any one of claims 1 to 3, wherein:
   in the forming the cavity in the core substrate, the core substrate is a metal core substrate,
   the forming the cavity in the core substrate includes:
      forming a first resist layer on an upper surface of the metal core substrate so as to have an opening corresponding to the cavity;
      forming a second resist layer in a lower surface of the metal core substrate so as to have openings corresponding to the plurality of through-holes; and
      performing wet etching on the metal core substrate from both surface sides, using the first resist layer and the second resist layer as masks, respectively, and
   the wet etching is set such that an etching rate of the upper surface side of the core substrate is higher than an etching rate of the lower surface side of the core substrate.

What is claimed is:

1. An electronic component built-in substrate comprising:
   a core substrate;
   a cavity formed on an upper surface side of the core substrate;
   a bottom plate of the cavity formed integrally with and connected directly to the core substrate;
   a plurality of through-holes formed in and partitioned by the bottom plate;
   a component mounting portion formed at a portion of the bottom plate;
   an electronic component mounted on the component mounting portion so as to be disposed inside the cavity, a part of an outer circumference of the electronic component overlapping with the plurality of through-holes when viewed in plan view;
   a first insulating layer formed on an upper surface of the core substrate so as to cover an upper surface of the electronic component; and
   a second insulating layer formed on a lower surface of the core substrate so as to fill the through-hole and cover a lower surface of the electronic component,
   wherein,
   the cavity is filled with the first insulating layer and the second insulating layer, and
   the first insulating layer and the second insulating layer are formed of the same insulating resin.

2. The electronic component built-in substrate according to claim 1, wherein:
   the component mounting portion is formed at the portion of the bottom plate disposed between the plurality of through-holes.

3. The electronic component built-in substrate according to claim 2, wherein:
   the cavity of the core substrate is formed in a quadrangle shape as seen in a plan view,
   on both sides of the bottom plate of the cavity, two through-holes are disposed, and
   at a central portion of the cavity, the component mounting portion is disposed.

4. The electronic component built-in substrate according to claim 2, wherein:
   the electronic component is a capacitor having connection terminals on both end sides,
   a central portion of the capacitor is fixed on the component mounting portion, and
   the capacitor is disposed such that the connection terminals of both end sides of the capacitor overlap the plurality of through-holes, respectively, as seen in a plan view.

5. The electronic component built-in substrate according to claim 4, further comprising:
   via holes formed in the second insulating layer so as to reach lower surfaces of the connection terminals of the electronic component through the through-holes; and a wiring layer formed on lower surface of the second insulating layer so as to be connected to the lower surfaces of the connection terminals of the electronic component by via holes.

6. The electronic component built-in substrate according to claim 1, wherein:
the component mounting portion is formed in a stripe shape as seen in a plan view.

7. The electronic component built-in substrate according to claim 1, wherein:
the electronic component is fixed on the component mounting portion by an adhesive.

8. The electronic component built-in substrate according to claim 1, wherein:
the core substrate is a metal core substrate.

9. The electronic component built-in substrate according to claim 1, wherein the bottom plate is part of the core substrate.

10. The electronic component built-in substrate according to claim 1, wherein the bottom plate and the core substrate are formed of a same material.

11. The electronic component built-in substrate according to claim 1, wherein:
a part of the lower surface of the electronic component is exposed from the plurality of through holes and directly covered by the second insulating layer.

12. The electronic component built-in substrate according to claim 1, wherein:
the cavity of the core substrate is formed in a quadrangle shape having four sides as seen in a plan view,
the plurality of through holes includes two through-holes disposed on both sides of the bottom plate of the cavity,
the component mounting portion is disposed at a central portion of the cavity,
the component mounting portion is formed in a stripe shape which extends straightly from one side of the cavity toward a second side of the cavity opposing the one side as seen in a plan view.

13. The electronic component built-in substrate according to claim 1, wherein:
in a cross-sectional view, the component mounting portion includes a component mounting portion upper surface, a component mounting portion lower surface, and a component mounting portion side surface, the component mounting portion upper surface being longer than the component mounting portion lower surface, and the component mounting portion side surface connecting the component mounting portion upper surface and the component mounting portion lower surface, the component mounting portion side surface being curved inwardly from the component mounting portion upper surface toward the component mounting portion lower surface, and the electronic component being mounted on the component mounting portion upper surface.

14. An electronic component device comprising:
an electronic component built-in substrate which includes
a core substrate,
a cavity formed on an upper surface side of the core substrate,
a bottom plate of the cavity formed integrally with and connected directly to the core substrate,
a plurality of through-holes formed in and partitioned by the bottom plate
a component mounting portion formed at a portion of the bottom plate,
a first electronic component mounted on the component mounting portion so as to be disposed inside the cavity, a part of an outer circumference of the first electronic component overlapping with the plurality of through-holes when viewed in plan view,
a first insulating layer formed on an upper surface of the core substrate so as to cover an upper surface of the first electronic component, and
a second insulating layer formed on a lower surface of the core substrate so as to fill the through-hole and cover a lower surface of the first electronic component; and
a second electronic component mounted on the electronic component built-in substrate so as to be electrically connected to the first electronic component,
wherein the cavity is filled with the first insulating layer and the second insulating layer, and
the first insulating layer and the second insulating layer are formed of the same insulating resin.

15. The electronic component device according to claim 14, wherein:
the component mounting portion is formed at the portion of the bottom plate disposed between the plurality of through-holes.

16. The electronic component device according to claim 14, wherein the bottom plate is part of the core substrate.

17. The electronic component device according to claim 14, wherein the bottom plate and the core substrate are formed of a same material.

18. The electronic component device according to claim 14, wherein:
a part of the lower surface of the first electronic component is exposed from the plurality of through holes and directly covered by the second insulating layer.

19. The electronic component device according to claim 14, wherein:
the cavity of the core substrate is formed in a quadrangle shape having four sides as seen in a plan view,
the plurality of through holes includes two through-holes disposed on both sides of the bottom plate of the cavity,
the component mounting portion is disposed at a central portion of the cavity,
the component mounting portion is formed in a stripe shape which extends straightly from one side of the cavity toward a second side of the cavity opposing the one side as seen in a plan view.

20. The electronic component device according to claim 14, wherein:
in a cross-sectional view, the component mounting portion includes a component mounting portion upper surface, a component mounting portion lower surface, and a component mounting portion side surface, the component mounting portion upper surface being longer than the component mounting portion lower surface, and the component mounting portion side surface connecting the component mounting portion upper surface and the component mounting portion lower surface, the component mounting portion side surface being curved inwardly from the component mounting portion upper surface toward the component mounting portion lower surface, and the first electronic component being mounted on the component mounting portion upper surface.

* * * * *